(12) United States Patent
Poorman

(10) Patent No.: US 7,116,522 B2
(45) Date of Patent: Oct. 3, 2006

(54) SYSTEM AND METHOD RELATED TO A FLEXIBLE CIRCUIT

(75) Inventor: Paul W. Poorman, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 233 days.

(21) Appl. No.: 10/440,573

(22) Filed: May 19, 2003

(65) Prior Publication Data

US 2004/0233581 A1 Nov. 25, 2004

(51) Int. Cl.
*G11B 5/48* (2006.01)
(52) U.S. Cl. .................................. 360/241; 360/241.1
(58) Field of Classification Search ............... 360/241, 360/291, 251.1, 260, 261.1, 290, 241.1, 245.8; 174/250, 254; 439/67, 77, 493; 361/749
See application file for complete search history.

(56) References Cited

U.S. PATENT DOCUMENTS

| | | | | |
|---|---|---|---|---|
| 5,325,252 A | * | 6/1994 | Yagi et al. ................ | 360/236.7 |
| 5,400,195 A | | 3/1995 | Morij et al. | |
| 5,446,240 A | * | 8/1995 | Hayakawa et al. ........... | 174/69 |
| 5,862,014 A | | 1/1999 | Nute | |
| 5,940,252 A | * | 8/1999 | Patterson ................. | 360/264.2 |
| 5,963,399 A | * | 10/1999 | Briggs et al. ............ | 360/266.3 |
| 5,979,813 A | | 11/1999 | Mansbridge et al. | |
| 6,072,643 A | * | 6/2000 | Nishio et al. ................ | 359/824 |
| 6,078,483 A | | 6/2000 | Anderson | |
| 6,151,188 A | | 11/2000 | Takano et al. | |
| 6,404,598 B1 | | 6/2002 | Nayak et al. | |
| 6,737,589 B1 | * | 5/2004 | Adachi et al. .............. | 174/254 |
| 2002/0076960 A1 | * | 6/2002 | Ibaraki et al. .............. | 439/165 |
| 2002/0189854 A1 | * | 12/2002 | Crumly ....................... | 174/254 |
| 2003/0116343 A1 | * | 6/2003 | Adachi et al. .............. | 174/254 |

FOREIGN PATENT DOCUMENTS

| | | | | |
|---|---|---|---|---|
| JP | 0318784 A | * | 8/1991 | |
| JP | 04239676 A | * | 8/1992 | |
| JP | 06132057 A | * | 5/1994 | |
| JP | 06169139 A | * | 6/1994 | |
| JP | 06215530 A | * | 8/1994 | |
| JP | 06349650 A | * | 12/1994 | |
| JP | 07037662 A | * | 2/1995 | |
| JP | 08116140 A | * | 5/1996 | |
| JP | 08139455 A | * | 5/1996 | |
| JP | 08293172 A | * | 11/1996 | |
| JP | 09205256 A | * | 8/1997 | |
| JP | 09205257 A | * | 8/1997 | |
| JP | 11195850 A | * | 7/1999 | |
| JP | 2000231833 A | * | 8/2000 | |

* cited by examiner

*Primary Examiner*—William J. Klimowicz

(57) ABSTRACT

A tape drive comprises a magnetic head and a flexible circuit coupled to the magnetic head. The flexible circuit comprises a rolling loop and a double layer portion that extends at least partially through the rolling loop.

12 Claims, 4 Drawing Sheets

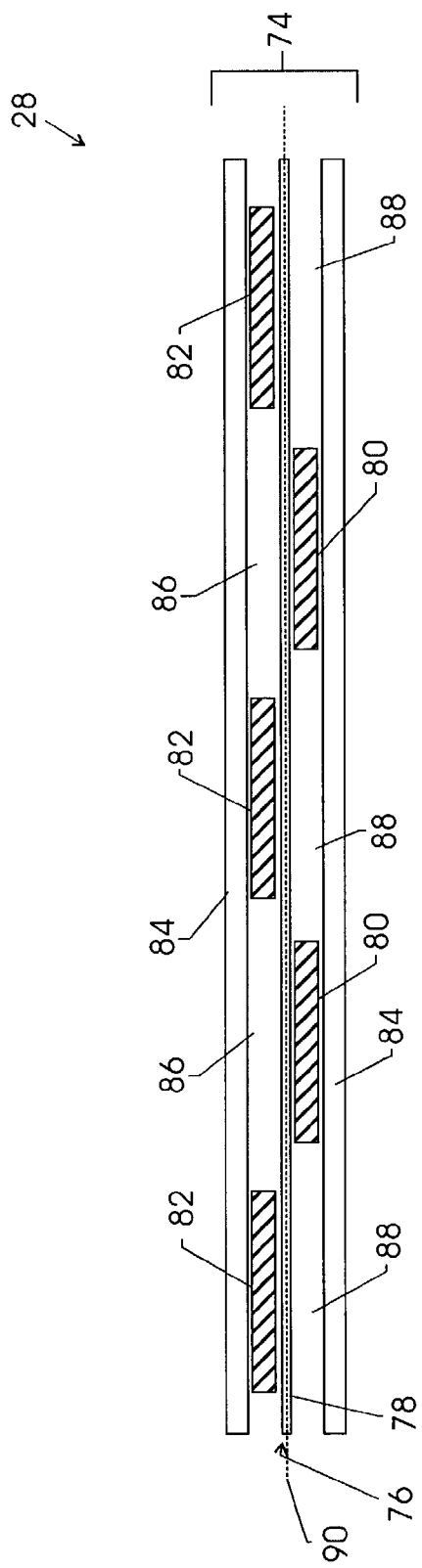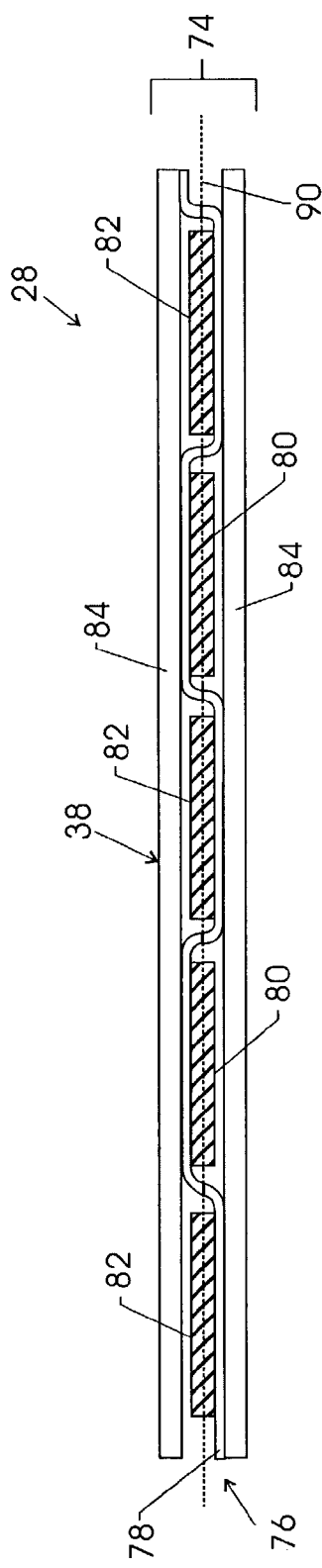

SYSTEM AND METHOD RELATED TO A
FLEXIBLE CIRCUIT

BACKGROUND OF THE INVENTION

Flexible circuits are used with devices, such as tape drives. For example, a flexible circuit can be coupled to the multichannel thin film magneto-resistive tape heads used in a tape drive. With multichannel tape heads, many leads are required to read data, write data and sense servo information on the tape. For an eight channel data head, for example, 80 or more traces may be divided between two separate flex circuits. Additionally, shield connectors, ground lines and substrate connections can increase the number of traces utilized. Furthermore, 16 channel tape heads are becoming more readily available, and such heads can require, for example, 160 traces spread over two flex circuits. As the number of channels increases, difficulties arise in routing the flexible circuit due to, for example, width of the flexible circuit and/or increased stresses on the traces.

SUMMARY

In one embodiment of the present invention, a tape drive is provided. The tape drive comprises a magnetic head and a carriage to carry the magnetic head. Additionally, the tape drive comprises a flexible circuit having a rolling loop. The flexible circuit also comprises a double layer portion that extends at least partially through the rolling loop.

Another embodiment relates to a multichannel device. The multichannel device comprises a flexible circuit having a first plurality of traces arranged in a first layer and a second plurality of traces arranged in a second layer. The flexible circuit further comprises a substrate disposed between the first layer and the second layer and an outer insulation layer. Additionally, the flexible circuit comprises a rolling loop region and stiffness reducer to relieve trace stresses in the rolling loop region.

Another embodiment relates to a method that comprises forming a double layer flexible circuit with a pair of trace layers, a substrate between the pair of trace layers and an outer insulation layer. The method further comprises bending the double layer flexible circuit along a rolling loop and reducing the stiffness of the double layer flexible circuit along the rolling loop.

BRIEF DESCRIPTION OF THE DRAWINGS

Certain embodiments of the invention will hereafter be described with reference to the accompanying drawings, wherein like reference numerals denote like elements, and:

FIG. 5 is a cross-sectional view taken generally along the line 5—5 of FIG. 1; and FIG. 6 is a cross-sectional view similar to FIG. 5 showing an alternate embodiment.

DETAILED DESCRIPTION

Figure 1:
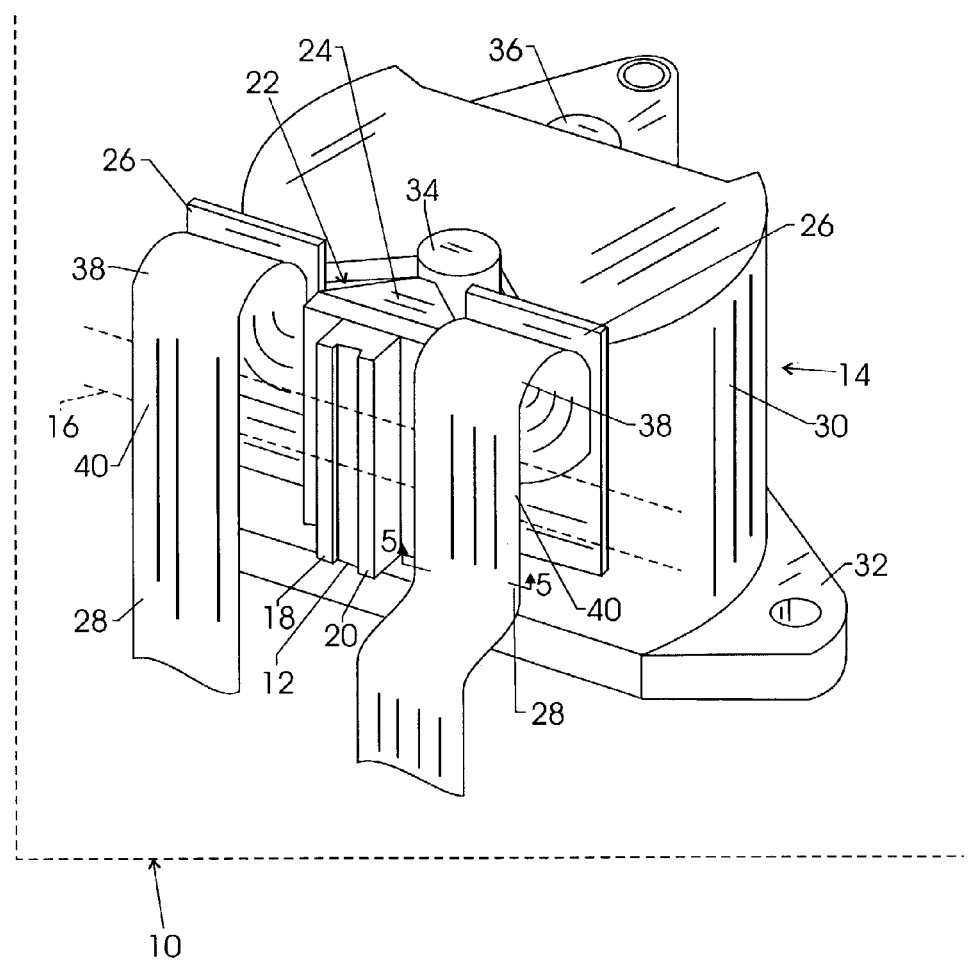
FIG. 1 is a perspective view of an embodiment of a tape drive head actuator positioned in a tape drive and having a flexible circuit according to an embodiment of the present invention.

Referring generally to FIG. 1, a device 10 is illustrated according to an embodiment of the present invention. By way of example, device 10 will be described as a tape drive. The illustrated tape drive 10 comprises a head 12, such as a magnetic head, mounted on a carriage assembly 14. Head 12 may be used to engage a tape 16 as tape 16 moves across a face of head 12 to record data on tape 16 and/or to read data from tape 16.

As illustrated in FIG. 1, head 12 may comprise at least one, e.g. two, head "bumps" 18, 20. In this example, each head bump 18 and 20 functions as an individual head capable of recording to and reading information from tape 16. For example, as the lead head bump records or writes data to the tape, the second head bump may be used to read the recorded data to detect errors. Each of the read/write head bumps 18 and 20 may comprise a single read/write element or a series of read/write elements stacked along the head to enable head 12 to read from or write to several tracks at the same time.

Head 12 may be part of a head assembly 22 having a head carrier 24 to which head 12 is mounted. Head assembly 22 also may have at least one flexible circuit stiffener 26. In the embodiment illustrated, the head subassembly 22 comprises a pair of flexible circuit stiffeners 26.

A flexible circuit 28 is coupled to head 12 by, for example, the flexible circuit stiffener 26. Flexible circuits 28 may be affixed to corresponding circuit stiffeners 26 via an appropriate connection mechanism, such as an adhesive or other fastener. Flexible circuits 28 also are electrically coupled with head 12 and provide communication paths for data and servo information to and from head 12.

By way of example, carrier assembly 14 may comprise a magnetic housing 30 supported by an actuator base 32. Additionally, carriage assembly 14 may be movable to allow reciprocal motion along a primary guide rail 34 and a secondary guide rail 36. Head 12 is mounted to carriage assembly 14 and thus is moved by carriage assembly 14 in a direction generally perpendicular to the direction of tape travel for proper positioning of the head elements during reading and writing operations. Movement of carriage assembly 14 may be accomplished, for example, with an actuator, such as a voice coil motor (not shown).

Although an embodiment of a tape drive head assembly has been illustrated and described herein, it should be noted that a variety of tape drives and other devices may be utilized with flexible circuits 28. Additionally, various tape drive head assemblies, as well as tape drive head components, may be utilized with at least one of the flexible circuits 28. For example, head 12 may be an 8-channel data head, a 16-channel data head, or other N-channel data heads.

As illustrated, an embodiment of each flexible circuit 28 is formed with a rolling loop 38. Rolling loop 38 tends to minimize and linearize detrimental forces acting on the traces within each flexible circuit 28 as head 12 moves relative to the path of tape 16. Tape 16 may be positioned to pass between head 12 and each flexible circuit 28. For example, tape 16 may be positioned between a generally flat section 40 of each flexible circuit 28 that extends to rolling loop region 38.

Figure 2:
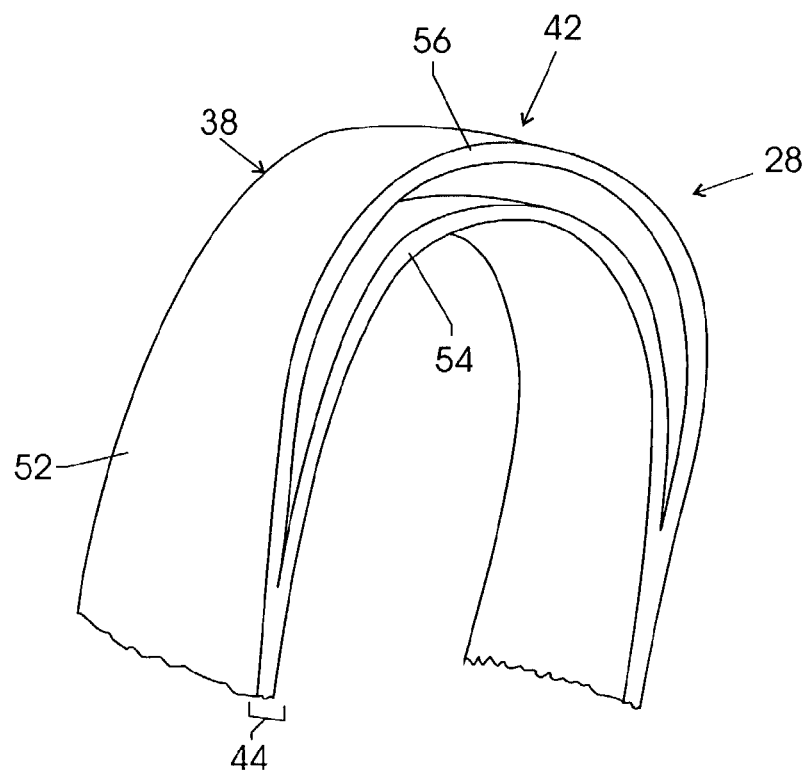
FIG. 2 is a side view of an embodiment of a flexible circuit illustrated in FIG. 1.
Figure 3:
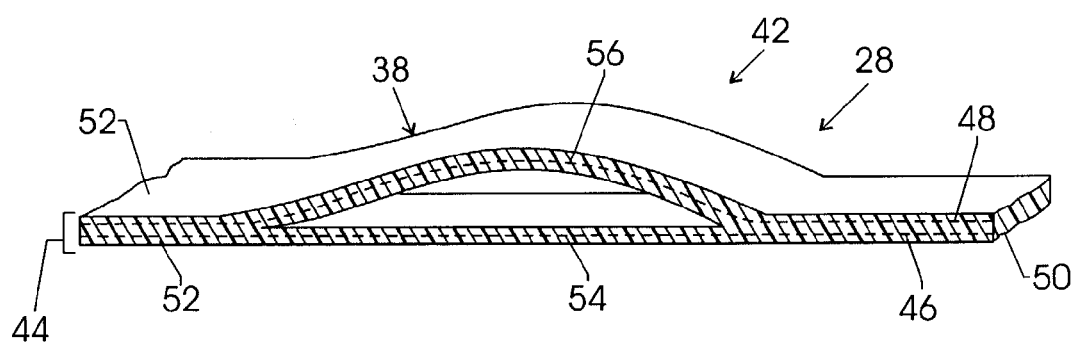
FIG. 3 is a cross-sectional view of the flexible circuit illustrated in FIG. 2 according to an embodiment of the present invention.

Referring generally to FIGS. 2 and 3, an embodiment of flexible circuit 28 is illustrated. In this embodiment, flexible circuit 28 is formed with a stiffness reducer 42 designed to relieve trace stresses in rolling loop region 38. The flexible circuit 28 may be formed as a double layer flexible circuit, at least in the region of rolling loop 38. For example, the flexible circuit 28 may comprise a double layer configuration 44 along its entire length, as illustrated in FIG. 3.

In this embodiment, a first plurality of traces 46 is separated from a second plurality of traces 48 by a substrate 50, such as an insulative polymeric material substrate. Additionally, an outer insulation layer 52 may be disposed along the exterior of first plurality of traces 46 and second plurality of traces 48. The first plurality of traces 46 may be arranged in a first layer, and the second plurality of traces 48 may be arranged in a second layer generally parallel with the first layer.

In rolling loop region 38, substrate 50 is split to form an adjacent pair of rolling loop portions 54 and 56, respectively. As illustrated best in FIG. 3, rolling loop portion 56 may be slightly longer than rolling loop portion 54 to better accommodate both formation of rolling loop 38 and flexing of the rolling loop during operation of tape drive 10.

When substrate 50 is split or separated, the first plurality of traces 46 extends through rolling loop portion 54, and the second plurality of traces 48 extends through rolling loop portion 56. Thus, the thickness of each rolling loop portion 54, 56 is less than the overall thickness of flexible circuit 28. For example, substrate 50 may be split such that the thickness of each rolling loop portion 54, 56 is approximately half the combined thickness of the two layers.

Formation of the two rolling loop portions 54, 56 reduces the overall stiffness of rolling loop 38. Generally, stiffness decreases by the cube of the thickness, and by separating the double layer portion 44 of flexible circuit 28 into two separate layers at rolling loop 38, the overall stiffness is decreased by approximately a factor of four. Furthermore, within each rolling loop portion 54, 56 the plurality of traces are at approximately the neutral axis of their cross-section. This configuration also reduces the stresses that can otherwise lead to trace breakage as head 12 moves to access different tracks on tape 16.

Figure 4:
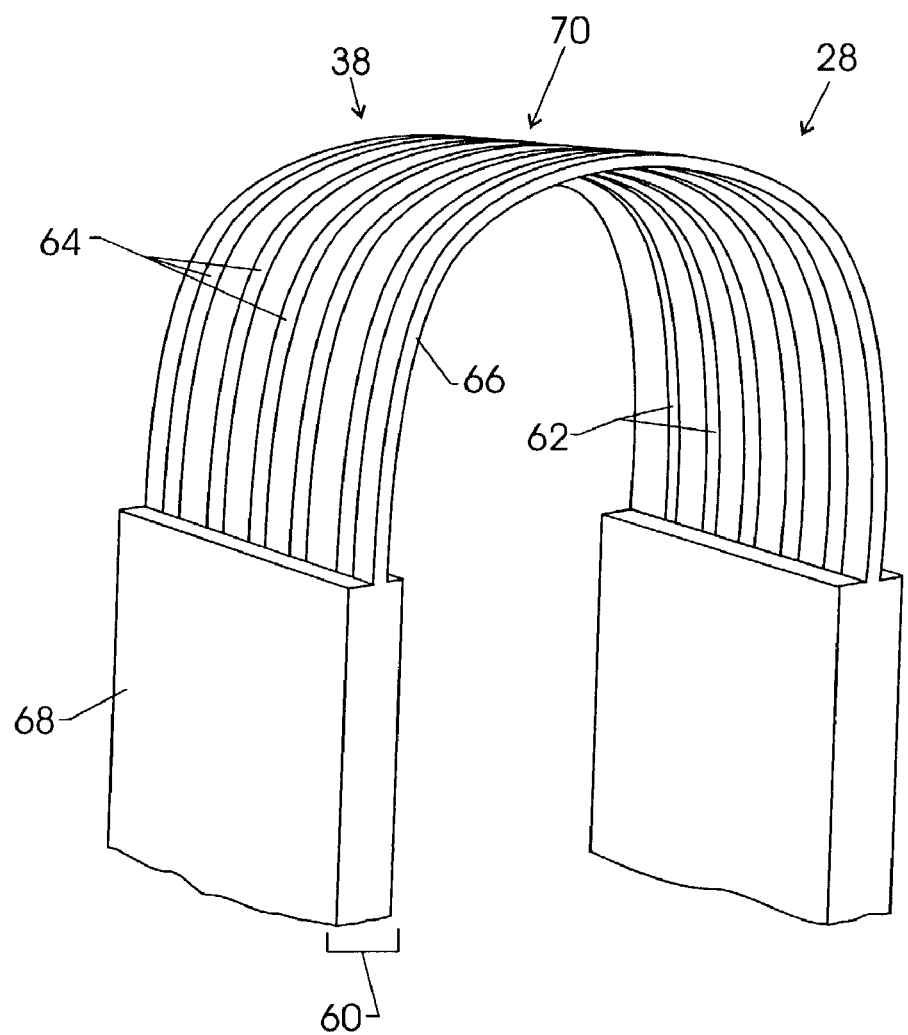
FIG. 4 is another embodiment of the flexible circuit illustrated in FIG. 1.

Referring generally to FIG. 4, another embodiment of flexible circuit 28 is illustrated. In this embodiment, flexible circuit 28 also may comprise a double layer flexible circuit 60 having generally parallel layers of traces. For example, a first layer of traces 62 may be separated from a second layer of traces 64 by a substrate 66. Additionally, an outer insulation layer 68 is disposed along the exterior of traces 62, 64 over at least a portion of flexible circuit 28.

In this embodiment, a stiffness reducer 70 is disposed over at least a portion of rolling loop 38. Stiffness reducer 70 may be constructed by removing a portion of outer insulative layer 68 in the region of rolling loop 38. Removal of outer insulative layer 68 can be achieved by, for example, cutting away outer insulation layer 68 adjacent the first and second trace layers 62, 64 or by forming a portion of the flexible circuit with no outer insulation layer.

Stiffness reducer 70 may be formed such that the first layer of traces 62 and the second layer of traces 64 are exposed along their exterior surfaces. Alternatively, the traces may be covered with a thin layer of outer insulation material 68 or coated with a corrosion resistant material. By reducing the thickness of double layer flexible circuit 60 in the region of rolling loop 38, the stiffness of flexible circuit 28 is reduced along its rolling loop 38. The reduction in stiffness reduces the stress on traces, e.g. first layer of traces 62 and second layer of traces 64, during movement of head 12.

Referring generally to FIGS. 5 and 6, another embodiment of flexible circuit 28 is illustrated. In this embodiment, each flexible circuit 28 is formed as a double layer flexible circuit 74. A stiffness reducer 76 may comprise a thin substrate layer 78 that extends at least through rolling loop 38. A first plurality of traces 80 is disposed on one side of thin substrate layer 78, and a second plurality of traces 82 is disposed on an opposite side of thin substrate layer 78. An outer insulation layer 84 surrounds an exterior of traces 80 and 82 as in the embodiments described above. In the embodiment illustrated in FIGS. 5 and 6, thin substrate layer 78 has a thickness substantially less than the thickness of outer insulation layer 84.

The first plurality of traces 80 and the second plurality of traces 82 may be arranged in a staggered formation. When staggered, traces 80 are generally aligned with gaps 86 disposed between the traces of second plurality of traces 82. Similarly, traces 82 lie generally adjacent gaps 88 formed between the traces of first plurality of traces 80. Accordingly, when the flexible circuit 28 is generally linear, thin substrate layer 78 is substantially planar along a neutral bending axis 90.

As the flexible circuit 28 is bent, such as through rolling loop 38, the traces of the first and second plurality of traces 80, 82 are moved towards the neutral bending axis 90, as best illustrated in FIG. 6. Simultaneously, thin substrate layer 78 is moved into an undulating configuration as the traces are pushed inwardly along rolling loop 38. Movement of the traces towards the neutral bending axis further reduces trace stresses during movement of head 12.

Alternatively, the traces 80 and 82 may be permanently formed in the offset pattern illustrated in FIG. 6. In this embodiment, for example, thin substrate layer 78 is flexed around traces 80 and 82, as illustrated in FIG. 6, prior to laminating the flexible circuit 28. Subsequently, the flexible circuit is laminated, and the arrangement of traces 80 and 82 is set with substrate layer 78 undulating back and forth through the traces.

Regardless of whether the first plurality of traces 80 and the second plurality of traces 82 are staggered or otherwise arranged, however, the thin substrate layer 78 reduces the stiffness of the double layer flexible circuit as well as reducing trace stresses. The reduction in overall thickness of the flexible circuit 28 substantially reduces the stiffness of the flexible circuit through rolling loop 38, as described above.

In one embodiment, thin substrate layer 78 has a thickness in the range from approximately 0.0125 millimeters to approximately 0.017 millimeters. By way of example, the thin substrate layer 78 may be a polyamide film, such as Kapton® polyamide film available from DuPont Corporation.

By using a stiffness reducer, particularly in the region of rolling loop 38, double layer flexible circuits 28 can be utilized without incurring the otherwise expected stresses, particularly through the rolling loop regions. Consequently, the frequency of trace breakage is lowered. The reduced stiffness also enables use of a greater number of traces in flexible circuits and facilitates, for example, incorporation of 16 channel heads utilizing 160 or more traces into a variety of systems.

While the invention may be susceptible to various modifications and alternative forms, specific embodiments have been shown by way of example in the drawings and described in detail herein. However, it should be understood that the invention is not intended to be limited to the particular forms disclosed.

What is claimed is:

1. A tape drive, comprising:
   a magnetic head;
   a carriage to carry the magnetic head; and a flexible circuit coupled to the magnetic head, the flexible circuit comprising: a rolling loop;

a double layer portion that extends at least partially through the rolling loop; and a reduced stiffness region including a pair of separated rolling loops that extend at least partially through the rolling loop, wherein the double layer portion comprises first and second layers coupled together at least on opposite lengthwise sides of the reduced stiffness region, and the pair of rolling loops separate at a first location in the reduced stiffness region and reconnect at a second location in the reduced stiffness region.

2. The tape drive as recited in claim 1, wherein the double layer portion extends along the entire flexible circuit.

3. The tape drive as recited in claim 1, wherein the reduced stiffness region has a lower stiffness relative to an adjacent portion of the flexible circuit.

4. The tape drive as recited in claim 1, wherein the reduced stiffness region comprises a reduced thickness of the flexible circuit.

5. The tape drive as recited in claim 1, wherein the magnetic head comprises a pair of magnetic heads.

6. A multichannel device, comprising:

a flexible circuit having a first plurality of traces arranged in a first layer, a second plurality of traces arranged in a second layer, a substrate disposed between the first layer and the second layer, and an outer insulation layer, the flexible circuit further comprising a rolling loop region and a stiffness reducer to relieve trace stresses in the rolling loop region, wherein the first layer is adjacent the second layer at least on opposite lengthwise sides of the stiffness reducer, and the stiffness reducer comprises a reduced thickness of the substrate in the rolling loop region relative to the thickness of the outer insulation layer.

7. The multichannel device as recited in claim 6, wherein the stiffness reducer is formed by splitting the substrate in the rolling loop region.

8. A method, comprising:

forming a double layer flexible circuit with a pair of trace layers, a substrate between the pair of trace layers and an outer insulation layer;

bending the double layer flexible circuit along a rolling loop; and reducing the stiffness of the double layer flexible circuit along the rolling loop by separating the pair of trace layers at a beginning of the rolling loop and reconnecting the pair of trace layers at an end of the rolling loop.

9. The method as recited in claim 8, wherein separating comprises making one substrate layer longer than the other substrate layer.

10. A system, comprising:

means for forming a double layer flexible circuit comprising a first layer and a second layer;

means for creating a rolling loop in the double layer flexible circuit to accommodate a tape utilized with a tape device; and means for reducing the stiffness of the double layer flexible circuit in the region of the rolling loop between regions where the first layer is coupled to the second layer by separating the first and second layers at a beginning of the rolling loop and reconnecting the first and second layers at an end of the rolling loop.

11. The system as recited in claim 10, wherein the means for forming comprises a pair of trace layers separated by a substrate.

12. The system as recited in claim 10, wherein the means for creating comprises a bend in the double layer flexible circuit disposed about the tape.

* * * * *

UNITED STATES PATENT AND TRADEMARK OFFICE
CERTIFICATE OF CORRECTION

PATENT NO. : 7,116,522 B2  Page 1 of 1
APPLICATION NO. : 10/440573
DATED : October 3, 2006
INVENTOR(S) : Paul W. Poorman It is certified that error appears in the above-identified patent and that said Letters Patent is hereby corrected as shown below:

On the Title page, Item (56), under "Foreign Patent Documents", in column 2, line 1, delete "0318784" and insert -- 03185784 --, therefor.

Signed and Sealed this

Sixteenth Day of November, 2010

David J. Kappos
*Director of the United States Patent and Trademark Office*